(12) United States Patent
Stiefvater et al.

(10) Patent No.: US 8,125,234 B2
(45) Date of Patent: Feb. 28, 2012

(54) PROBE CARD ASSEMBLY

(75) Inventors: Günter Stiefvater, Sulzburg (DE);
Wolfgang Hauser, Endingen (DE)

(73) Assignee: Micronas GmbH, Freiburg I. BR. (DE)

( * ) Notice: Subject to any disclaimer, the term of this patent is extended or adjusted under 35 U.S.C. 154(b) by 67 days.

(21) Appl. No.: 12/155,846

(22) Filed: Jun. 10, 2008

(65) Prior Publication Data
US 2008/0303540 A1 Dec. 11, 2008

(30) Foreign Application Priority Data
Jun. 11, 2007 (DE) .......... 10 2007 027 380

(51) Int. Cl.
*G01R 31/20* (2006.01)

(52) U.S. Cl. ......... 324/754.01; 324/754.03; 324/754.07; 324/500

(58) Field of Classification Search ........... 324/750–755
See application file for complete search history.

(56) References Cited

U.S. PATENT DOCUMENTS

| 5,847,571 | A | * | 12/1998 | Liu et al. | 324/754 |
| 5,850,148 | A | | 12/1998 | Nam | |
| 7,759,952 | B2 | * | 7/2010 | Garabedian et al. | 29/755 |
| 2003/0146770 | A1 | * | 8/2003 | Ivanov | 324/762 |
| 2005/0042932 | A1 | | 2/2005 | Mok et al. | |
| 2006/0022686 | A1 | * | 2/2006 | Fan et al. | 324/754 |
| 2006/0043984 | A1 | | 3/2006 | Miller et al. | |
| 2007/0089551 | A1 | | 4/2007 | Williams et al. | |
| 2009/0146675 | A1 | * | 6/2009 | Karklin et al. | 324/758 |

FOREIGN PATENT DOCUMENTS

EP 1717590 A1 11/2006
WO WO 2006/113708 A2 10/2006

* cited by examiner

*Primary Examiner* — Melissa Koval
*Assistant Examiner* — Trung Nguyen
(74) *Attorney, Agent, or Firm* — Muncy, Geissler, Olds & Lowe, PLLC

(57) ABSTRACT

The invention relates to a probe card assembly comprising a stiffener (1), comprising a PCB (2) disposed in the stiffener (1), and comprising a spider (3) supported by the stiffener and the PCB (2), said spider comprising at least one probe (30) to test a wafer (5). This probe card assembly of the PCB (2) is supported in a loosely decoupled manner in the stiffener (1) to prevent transmission of high thermally-induced warping effects.

14 Claims, 2 Drawing Sheets

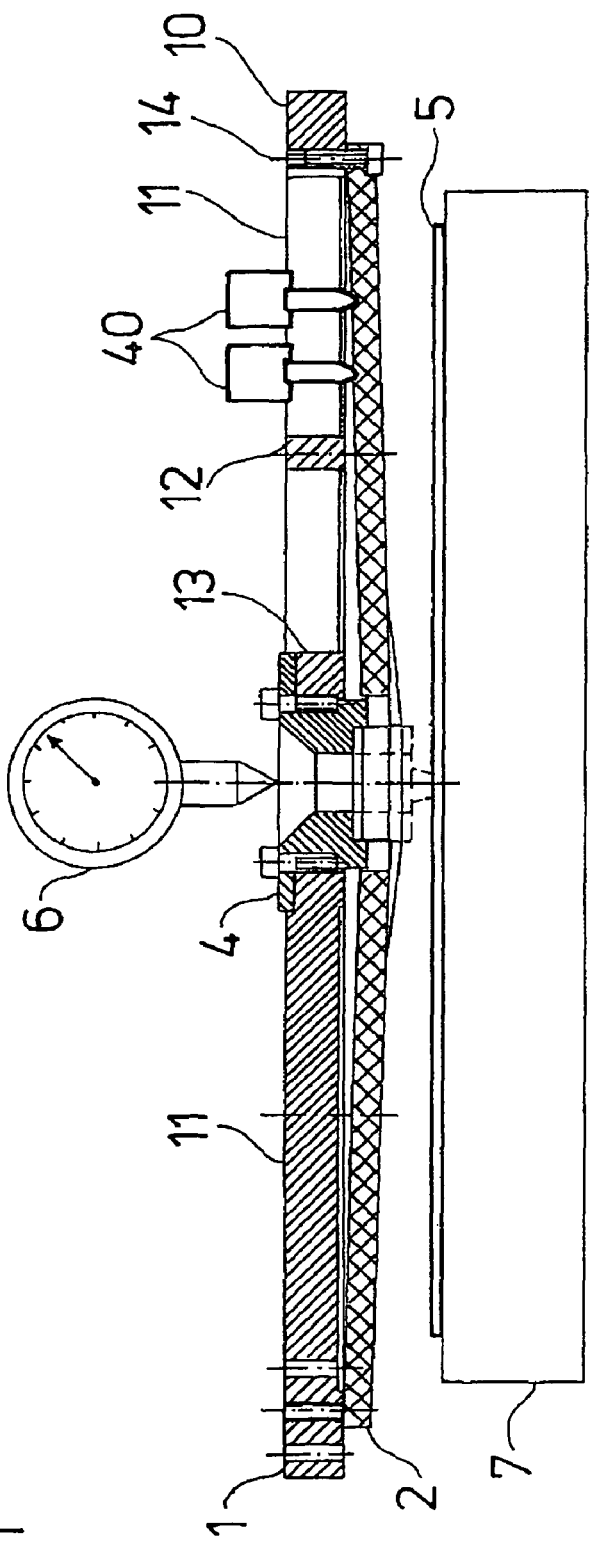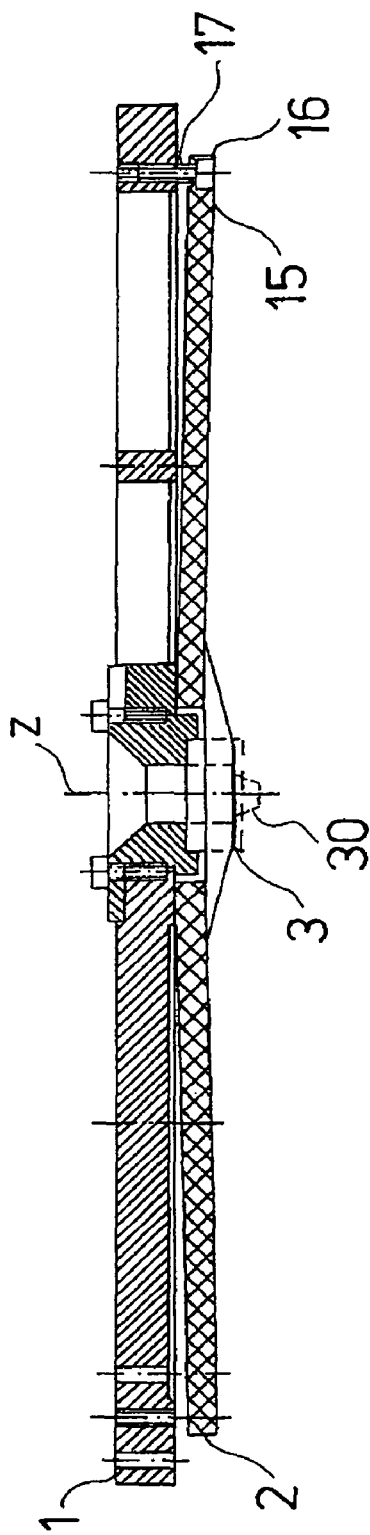

PROBE CARD ASSEMBLY

The invention relates to a probe card assembly comprising a PCB that is attached in a stiffener.

A probe card assembly is employed to test wafers that have an attached probe card. The probe card typically is composed of a PCB (printed circuit board), a spider, and a stiffener. The PCB is attached within the frame arrangement, identified as the stiffener, in the form of a stiffener ring. Centrally disposed within the arrangement are probes that are pressed using a specific overdrive of, in particular, 30-70 μm against a wafer surface of a wafer to be tested.

In the wafer test of the wafer using a heatable and/or coolable wafer receptacle, identified as a chuck, the wafer is supported underneath the PCB and brought to test temperature. In this process, the temperature of the bottom side of the PCB changes constantly relative to the top side. This results in variable warping of the PCB. The force of this warping is so strong that the stiffener too, which is tightly screwed to the PCB, is elastically deformed. Due to the deformation, the contact probes that are attached to the PCB or to the stiffener constantly move in a direction perpendicular to the support plane of the wafer and of the probe card assembly.

Testing in the border area, or a short pause in probe cleaning, results in a change in the contacting pressure of the probes. Changes of approximately 10 μm can be critical in terms of whether a tested product is assessed to be good or bad.

With these probe card assemblies, specific preheating times must be maintained for the wafer test in order to be able to run the test at all. These preheating times are required after loading a wafer, after aligning a loaded wafer, and additionally for a very considerable time after exchanging a probe card. This results in a long cycle time for the wafer test and a correspondingly low throughput. Even when these preheating times are adhered to, the danger remains of having defective measurements due to warping, including of the stiffener.

The object of the invention is to propose a probe card assembly to be attached to the PCB, which assembly provides improved compensation for unwanted effects resulting from strong warping in response to changes in temperature. In particular, the goal is to provide much less warping, or even no warping at all, in the stiffener.

This object is achieved by a probe card assembly having the features of claim 1. Advantageous embodiments of the invention are discussed in the subordinate claims.

What is preferred accordingly is a probe card assembly for attachment to a PCB, comprising a stiffener, a PCB disposed in the stiffener, and a spider held by the stiffener comprising at least one probe to test a wafer, wherein the PCB is supported on the stiffener in a loosely decoupled manner.

To compensate for bending of the PCB, the connections of the probes to the connecting point on the PCB must not be arranged tightly but instead in a curved pattern.

In a first embodiment, multiple screws with spacers are inserted between the PCB and the stiffener. The spacers are preferably designed as spacer sleeves that function like a shoulder screw.

The attachment elements are each preferably in the form of screws.

In a second embodiment combinable with the first, these attachment elements are attached to the stiffener or designed as an element of the stiffener, wherein the attachment elements engage behind a segment of the PCB. These attachment elements can be in the form of a clip or a hook.

The core concept of the technical implementation thus consists in mechanically decoupling the PCB from the stiffener during assembly and subsequent operation. This is enabled specifically by a floating support.

In an especially preferred embodiment, the depressions of the holes in the PCS have been modified such that the PCB is held with some play in all directions due to the spacer sleeves or shoulder screws. The play is sufficiently large here that the expansions and warping effects to the greatest extent possible do not transfer any mechanical forces to the stiffener. In addition, the PCB is centered by two alignment pins.

Alternatively or additionally, the assembly principle can also be achieved by underlaid soft materials, or such materials laid under the screw head of screws used for attachment.

If no pressure is exerted on the PCB by a test head or its pogo pins, then there is no need for these screws for attachment. In this case, the PCB is held relative to the stiffener, e.g., by claws or by certain forms of the PCB or of the stiffener that engage from behind or mutually engage.

In another advantageous embodiment, provision is made to develop or design the stiffener as a bridge. This can be advantageous in particular when no pressures are taken up by the pogo pins.

An embodiment of the invention is described below based on the drawing. In the drawing:

FIG. 1 is a cutaway view of a probe card assembly above a chuck with a first contacted wafer in a first operating position given a chuck temperature of >40 degrees;

FIG. 2 shows the assembly of FIG. 1 in a second operating position given a chuck temperature of <10 degrees Celsius;

Figure 3:
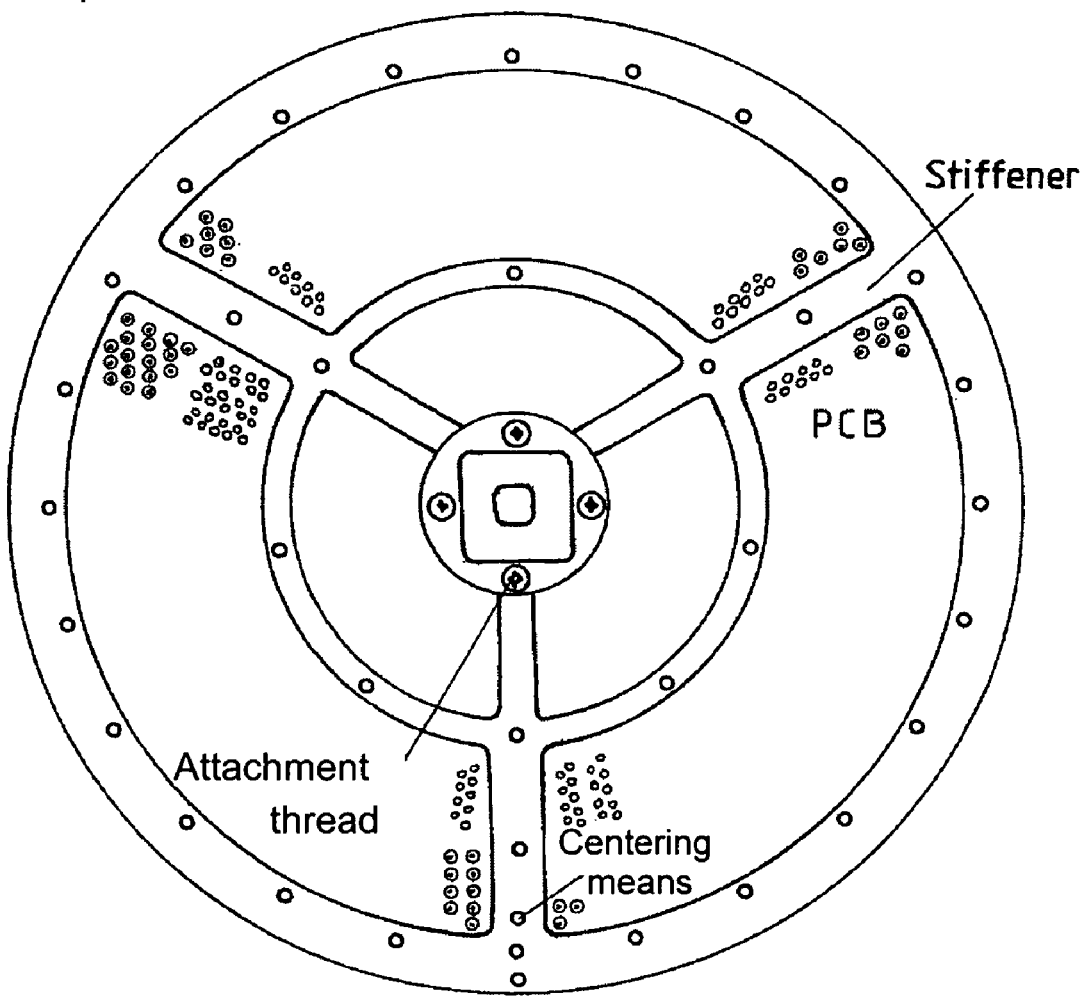
FIG. 3 is a top view of the assembly of FIG. 1.

As is evident in FIGS. 1 through 3, a probe card assembly or a probe card is composed essentially of a stiffener 1 to which a printed circuit board, hereafter identified as PCB 2 is supported. A test head spider 3 is supported centrally in stiffener 1 and the PCB by a spider holder 4. On the front side, that is, centrally in the Z axis of a wafer 5, one or more probes 30 are disposed on test head spider 3. Wafer 5 rests on a chuck 7 by which wafer 5 is brought to one or more temperatures desired for testing. Z-axis fluctuations of test head spider 3, caused by temperatures on the bottom of the PCB, can be detected by a measuring device 6 disposed on the back of spider holder 4 and outlined only symbolically.

In an arrangement such as that illustrated in FIG. 1, the prevailing test temperature is greater than an ambient temperature, where the test temperature=(chuck temperature) is in a range typically but not absolutely necessarily of 30° C.-200° C. FIG. 2 shows the case with a chuck temperature of <20° C. to −55° C.

Stiffener 1 is in the form of a frame, in particular, a reinforcement ring, of the general conventional type and is composed of an outer ring 10 in which rings 12, 13, and cross-bracings 11 are disposed. PCB 2 is attachable by multiple screws 15 by means of threaded holes 14 that are disposed in particular over the entire area, i.e., in rings 10, 12, 13. Screws 15 here pass through holes 14 in PCB 2.

Spider 3 and spider holder 4 are accommodated in a central passage opening of, inter alia, PCB 2. Rear spider holder 4 is attached to inner ring 13 of stiffener 1, in particular, screwed therein.

A floating support of PCB 2 on stiffener 1 functions in place of a rigid and fixed attachment of PCB 2 to provide compensation of temperature or an improved compensation of bending movements caused by changes in temperature. This floating support can be achieved in an especially preferred embodiment of PCB 2 by not screwing these screws 15 tightly against stiffener 1.

In a first and an especially preferred embodiment, hole 14 in the hole segment facing stiffener 1 is wide enough to insert a spacer sleeve 17 that is wider than threaded hole 14 in stiffener 1. This creates play for PCB 2.

A screw head 16 of screw 15 is thus tensioned toward stiffener 1 in or against PCB 2, wherein PCB 2 and stiffener 1 are held spaced apart by spacer sleeve 17 in an unstressed position by their mutually facing surfaces. As a result, play remains in effect for PCB 1 toward stiffener 1.

The arrangement of the attachment elements in the form of the one screw 15 outlined in the drawing is effected such that pressure from, e.g., close to 500 pogo pins 40 on the PCB can be accommodated by the plurality of screws that are disposed together with the spacer sleeves on rings 10, 12, 13. In the case of 500 such pogo pins, this is approximately 70 kp. The pogo pins function to pass electrical signals from the PCB to the tester or test head spider 3. (Note: what is meant by test head is the electronics and mechanism above the probe card. The test head relays the signals via the pogo pins to the tester.)

In an alternative embodiment, this effect can also be achieved by attaching PCB 2 to stiffener 1 directly with these screws 15 in a manner known per se, wherein however an elastic element is tensioned between these. The gripping force of the screw is selected such that PCBs 2 do not tightly compress the elastic element while PCB 2 is screwed against stiffener 1, but instead only a preferably low, or even no, prestress is applied that would compress the elastic element. As a result, the elastic element is able to be sufficiently compressed in response to a subsequent bending of PCB 2 due to thermal effect so as to be able to act compensatingly.

In further alternative embodiments, in particular, where no pressure is exerted by PCB 2 on test head spider 3, an externally encompassing attachment of PCB 2 on stiffener 1 with the aid, for example, of a claw-like attachment means is also sufficient for many applications:

In further alternative embodiments, for example, a shoulder screw can be used directly in place of screw 15 that is passed through separate spacer sleeve 17, the shoulder screw having a broadened segment between the threaded section and the screw head 16, thereby ensuring sufficient spacing of screw head 16 from the facing surface of stiffener 1.

The invention claimed is:

1. A probe card assembly for PCB (Printed Circuit Board) attachment, comprising:
   a stiffener;
   a PCB disposed in the stiffener and attached to the stiffener by a floating support, thereby supporting the PCB in a loosely decoupled manner to the stiffener, and
   a spider fixedly attached to the stiffener and supported by the stiffener and the PCB, the spider comprising at least one probe for testing a wafer,
   wherein the PCB is tightly supported laterally spaced from the test head by at least one attachment element in a direction of the stiffener, and wherein a spacing remains in effect between the PCB and the stiffener.

2. Probe card assembly according to claim 1, wherein a plurality of probes is arranged relative to the connection point of the probes in a curved pattern to compensate for bending of the PCB.

3. Probe card assembly according to claim 1, wherein the PCB is tightly supported laterally spaced from the test head by a plurality of attachment elements in the direction of the stiffener, and wherein a spacing remains in effect between the PCB and the stiffener.

4. Probe card assembly according to claim 3, wherein the at least one attachment element is in the form of a screw, wherein this screw has a broadened segment in the direction of the screw head, and wherein a corresponding opening hole of the PCB is sized so as to at least partially accommodate the broadened segment.

5. Probe card assembly according to claim 3, wherein these attachment elements are attached to the stiffener, and in which the attachment elements engage behind a segment of the PCB.

6. Probe card assembly according to claim 1, wherein a spacer is inserted between the at least one attachment element and the stiffener, and wherein an opening hole of the PCB is sized so as to partially accommodate the spacer.

7. Probe card assembly according to claim 6, wherein the spacer is in the form of a spacer sleeve that encompasses a shaft of a screw in the form of an attachment element.

8. Probe card assembly according to claim 1, wherein an elastic element is inserted between the PCB and the stiffener.

9. Probe card assembly according to claim 8, wherein the elastic element is inserted in an unstressed position for the PCB between the PCB and the stiffener with no, or only with little, prestress.

10. Probe card assembly according to claim 1, wherein the stiffener is designed in the form of a bridge.

11. Probe card assembly according to claim 1, further comprising the spider screwed to the stiffener to fixedly fasten the spider to the stiffener.

12. Probe card assembly according to claim 1, wherein the attachments elements are a screw, wherein the screw has a broadened segment in the direction of the screw head, and wherein a corresponding opening hole of the PCB is sized so as to at least partially accommodate the broadened segment.

13. A probe card assembly for PCB (Printed Circuit Board) attachment, comprising:
   a stiffener;
   a PCB disposed in the stiffener and attached to the stiffener by a floating support, thereby supporting the PCB in a loosely decoupled manner to the stiffener, and
   a spider fixedly attached to the stiffener and supported by the stiffener and the PCB, the spider comprising at least one probe for testing a wafer,
   wherein the PCB is tightly supported laterally spaced from the test head by a plurality of attachment elements in the direction of the stiffener,
   wherein a spacing remains in effect between the PCB and the stiffener, and
   wherein these attachment elements are an element of the stiffener, and wherein the attachment elements engage behind a segment of the PCB.

14. Probe card assembly according to claim 1, wherein a spacer is inserted between the at least one attachment element and the stiffener, and wherein an opening hole of the PCB is sized so as to entirely accommodate the spacer.

* * * * *